United States Patent [19]
Durkee et al.

[11] Patent Number: 5,465,227
[45] Date of Patent: Nov. 7, 1995

[54] REAL TIME AUTO-CORRELATION FILTER METHOD AND APPARATUS

[75] Inventors: Scott R. Durkee, New Haven; Erik A. Fjerstad, Shelburne, both of Vt.

[73] Assignee: Simmonds Precision Products, Inc., Akron, Ohio

[21] Appl. No.: 137,231

[22] Filed: Oct. 14, 1993

[51] Int. Cl.⁶ .............................. G06G 7/02; G06G 7/12
[52] U.S. Cl. .......................................... 364/825; 364/811
[58] Field of Search ................................ 364/825, 811, 364/606

[56] References Cited

U.S. PATENT DOCUMENTS

| | | | |
|---|---|---|---|
| 3,869,084 | 3/1975 | Longman, Jr. | 364/811 |
| 3,889,108 | 6/1975 | Cantrell | 235/152 |
| 3,917,936 | 11/1975 | Reader | 364/811 |
| 4,000,650 | 1/1977 | Snyder | 73/290 V |
| 4,037,095 | 7/1977 | Howells et al. | 364/811 |
| 4,054,786 | 10/1977 | Vincent | 364/811 |
| 4,232,381 | 11/1980 | Rennick et al. | 367/135 |
| 4,352,094 | 9/1982 | Reneric | 364/811 |
| 4,992,998 | 2/1991 | Woodward | 367/99 |
| 5,010,526 | 4/1991 | Linville, Jr. et al. | 364/825 X |
| 5,103,431 | 4/1992 | Freeman et al. | 367/135 |
| 5,150,324 | 9/1992 | Takasuka et al. | 364/606 |
| 5,157,596 | 10/1992 | Alcone | 364/148 |
| 5,161,113 | 11/1992 | Omura | 364/486 |

OTHER PUBLICATIONS

Computer Design, vol. 21, No. 4, Apr. 1982, Mazor, "Approaching Filters Discretely," pp. 159–162.
Review of Scientific Instruments, vol. 63, No. 5, May 1992, Black et al., "High–speed signal averaging system for periodic signals," pp. 3191–3195.
Arthur et al., "Analog Real–Time Statistical Analyzer Utilizing CCD's to Implement a Decision Algorithm," IEEE Transactions on Instrumentation and Measurement, vol. IM–29, No. 1, Mar. 1980, pp. 58–66.

Primary Examiner—Tan V. Mai
Attorney, Agent, or Firm—Leonard L. Lewis; William A. Zitelli; Richard A. Romanchik

[57] ABSTRACT

An auto-correlation filter for increasing the signal-to-noise ratio in a signal having synchronous analog components to be detected and associated asynchronous noise components includes a circuit for inputting a plurality of cycles of the signal and noise components; a circuit for digitizing the signal and noise components over a time period that is a function of the time duration of each cycle; a circuit for storing for an $n_{th}$ cycle the digitized components at the end of the time period until the start of an $n_{th}+1$ cycle; a circuit for converting the stored $n_{th}$ cycle digital components into a corresponding restored analog signal; and a circuit for summing the $n_{th}$ cycle restored analog signal with signal and noise components of the $n_{th}+1$ cycle.

24 Claims, 5 Drawing Sheets

REAL TIME AUTO-CORRELATION FILTER METHOD AND APPARATUS

BACKGROUND OF THE INVENTION

The invention relates generally to auto-correlation filters. More particularly, the invention relates to auto-correlation filters that can operate in a continuous real-time manner.

Auto-correlation filters are known and operate on the basic principle that synchronous signals can be discriminated from asynchronous signals or noise by summing repeated cycles of the signal. When such summation is performed over a relatively large number of cycles, the asynchronous signals average out to near zero, while the synchronous signal of interest remains at its average level.

As an example, ultrasonic sensor systems that use echo ranging produce output signals that include a true target echo and random noise signals and false echoes. In many cases, such as a liquid level sensor for example, a large number of transmit/receive cycles can be performed and the true echoes are substantially synchronous with each other, but may be small in magnitude compared to associated random noise from the system. Use of an auto-correlation filter can substantially improve the output signal-to-noise ratio.

Known auto-correlation filters typically operate on the basis of digital signal processing under the control of a microprocessor. The analog signals are digitized and then stored in digital memory devices. The multiple signals are then processed in digital form because of the need to retain the data for purposes of averaging. Such digital signal processing has numerous drawbacks. One drawback is that such signal processing demands high power digital processing usually realized with complicated software and a microprocessor controller. The use of digital memory storage also limits the ability to operate the filter in a real-time mode because the system must sample and store a number of data cycles and then interrupt data collection in order to perform the digital signal processing. After the auto-correlation process is completed, data collection is started over.

The objective exists, therefore, for auto-correlation filtering methods and apparatus that can operate in continuous real time without using microprocessor control circuits or other digital signal processing.

SUMMARY OF THE INVENTION

In response to the aforementioned objectives, the present invention contemplates in one embodiment an auto-correlation filter for increasing the signal-to-noise ratio in a signal having synchronous analog components to be detected and associated asynchronous components comprising: means for inputting a plurality of cycles of the synchronous and asynchronous components; means for storing the synchronous and asynchronous components for an $n_{th}$ cycle; and means for summing the $n_{th}$ cycle synchronous and asynchronous components with $n_{th}+1$ cycle synchronous and asynchronous components.

The invention further contemplates auto-correlation filtering methods embodied in use of such an auto-correlation filter, as well as an auto-correlation filtering method for increasing the signal-to-noise ratio in a signal having synchronous analog components to be detected and associated asynchronous components, comprising the steps of:

a. receiving a plurality of cycles of the synchronous and asynchronous components;

b. storing said synchronous and asynchronous components for an $n_{th}$ cycle until the start of an $n_{th}+1$ cycle;

c. summing in the analog domain said $n_{th}$ cycle and said $n_{th}+1$ cycle synchronous and asynchronous components; and d. repeating steps b and c for each of said plurality of cycles.

These and other aspects and advantages of the present invention will be readily understood and appreciated by those skilled in the art from the following detailed description of the preferred embodiments with the best mode contemplated for practicing the invention in view of the accompanying drawings.

DETAILED DESCRIPTION OF THE INVENTION

Figure 1:
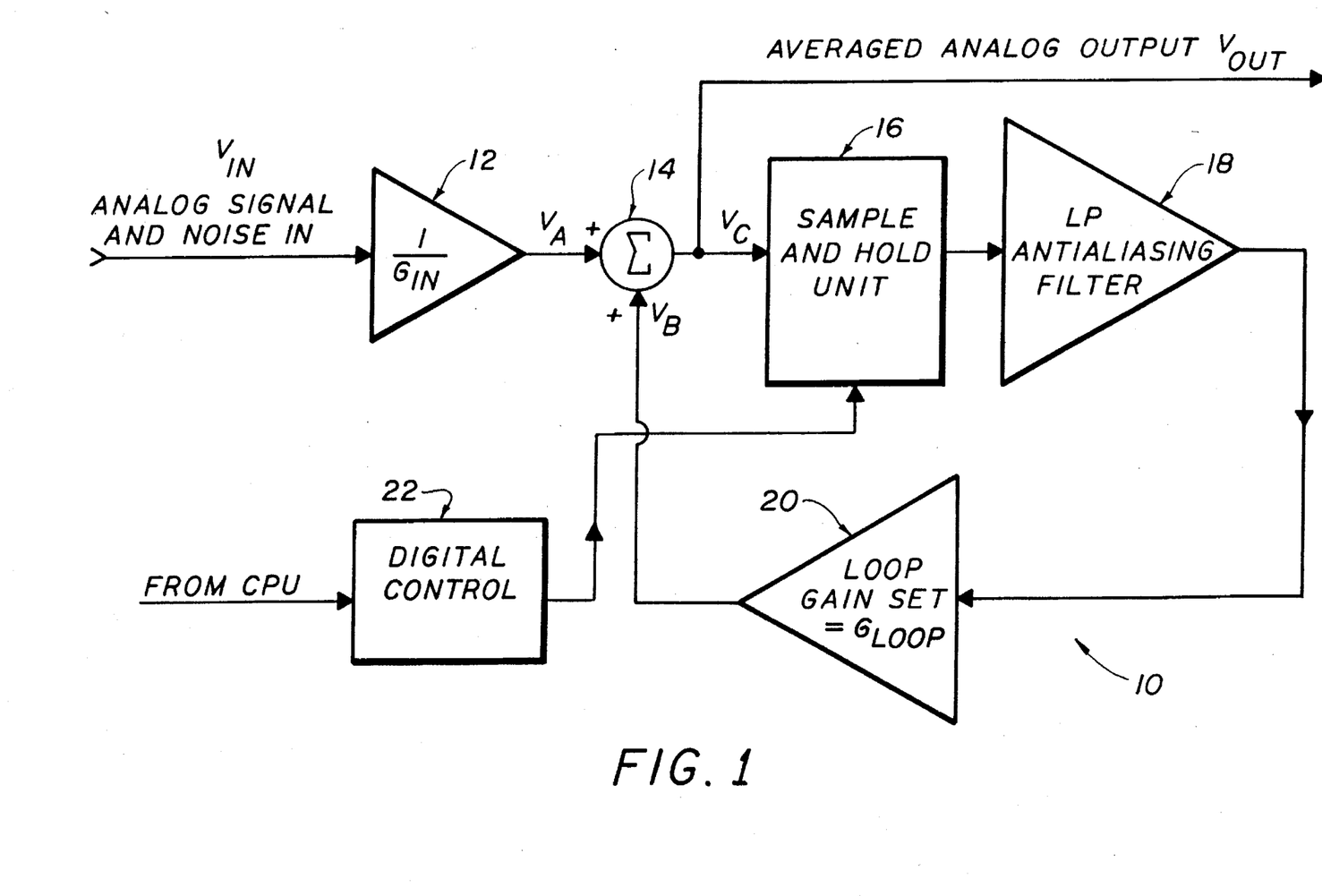
FIG. 1 is a simplified functional block diagram of an auto-correlation filter according to the present invention.

With reference to FIG. 1, I show an auto-correlation filter arrangement that includes several basic operational blocks. In accordance with an important aspect of the invention, it will be noted that the filter 10 does not depend on the use of digital signal processing (DSP), a microprocessor or complex software typically associated with DSP and similar designs. This feature of my invention is advantageous because the filter can operate on a real time basis, is simple to implement, and achieves a substantial improvement in the signal-to-noise ratio of the signal being analyzed. The filter also can operate in a continuous manner, in that the filtering aspect can be performed as each cycle of signal data is received, regardless of the rate at which such data is input to the filter. In other words, the operation of the filter does not depend on a particular or periodic rate of signal inputs to the filter. The only requirement, as with any auto-correlation filter, is that the signals or noise to be filtered must be asynchronous with respect to the synchronous signal being detected. The noise can be periodic so long as it is asynchronous. Furthermore, the synchronous signal need not be periodic, and in fact the cycles can occur at very slow rates without degrading the performance of the filter.

As an example, suppose that an auto-correlation filter is to be used with ultrasonic signal processing, in a system that produces ultrasonic pulses directed towards a target and receives ultrasonic echoes, such as for echo ranging. In this case, the detected ultrasonic echoes are converted by a transducer to analog electrical signals that include a true echo along with a substantial amount of noise and false echoes. Typically, the noise is asynchronous with respect to the true echo. The false echoes can also be asynchronous in many cases.

For purposes of this disclosure, I consider a data cycle or signal cycle as being that time period from the start or end of an ultrasonic transmit to the end of the echo listening period, or in other words one transmit/receive (T/R) cycle. The signal cycle can be analyzed based on the start of the transmit cycle, in which case the echo profile will include a large initial received "echo" from transducer ringing and backscatter. Alternatively, the signal cycle can be based on the end of the transmit cycle after a suitable blanking period to allow the transducer to return to steady state before transducing the received ultrasonic echoes. Either approach can be used depending on the particular application, and has no significant effect on use of the invention. During each such T/R cycle there typically will be numerous echoes (usually one true echo and any number of false echoes) received along with substantial noise. In most cases the echo signals will be of the same frequency as the transmit frequency of the ultrasonic pulses, but the noise can be of any frequency and even white noise such as from background interference.

Although the invention is described herein with respect to a particular embodiment for ultrasonic signal filtering, this description is intended to be exemplary and should not be construed in a limiting sense. The invention can be used in any application where an auto-correlation filter is needed or useful for noise reduction or cancellation associated with synchronously occurring signals of interest. Furthermore, the description herein of use of the filter with an ultrasonic fuel gauging system is also intended to be exemplary and not limiting in any sense with respect to other uses of the invention as will be readily understood by those skilled in the art.

In FIG. 1, the auto-correlation filter 10 includes an input amplifier 12 that can conveniently be realized in the form of a conventional differential amplifier. The input amplifier 12 receives the analog input signals ($V_{in}$) from the associated system electronics, such as an output from an ultrasonic transducer, for example. Each cycle of the input signal includes a synchronous component that is to be detected and asynchronous components or noise that is to be filtered. The input signals arrive at the input amplifier at a signal frequency determined by the transmit frequency of the ultrasonic transducer. The frequency of the T/R cycles received by the amplifier 12 is determined by the rate or period at which the T/R cycles occur, and this may or may not be a periodic repetition.

Figure 2:
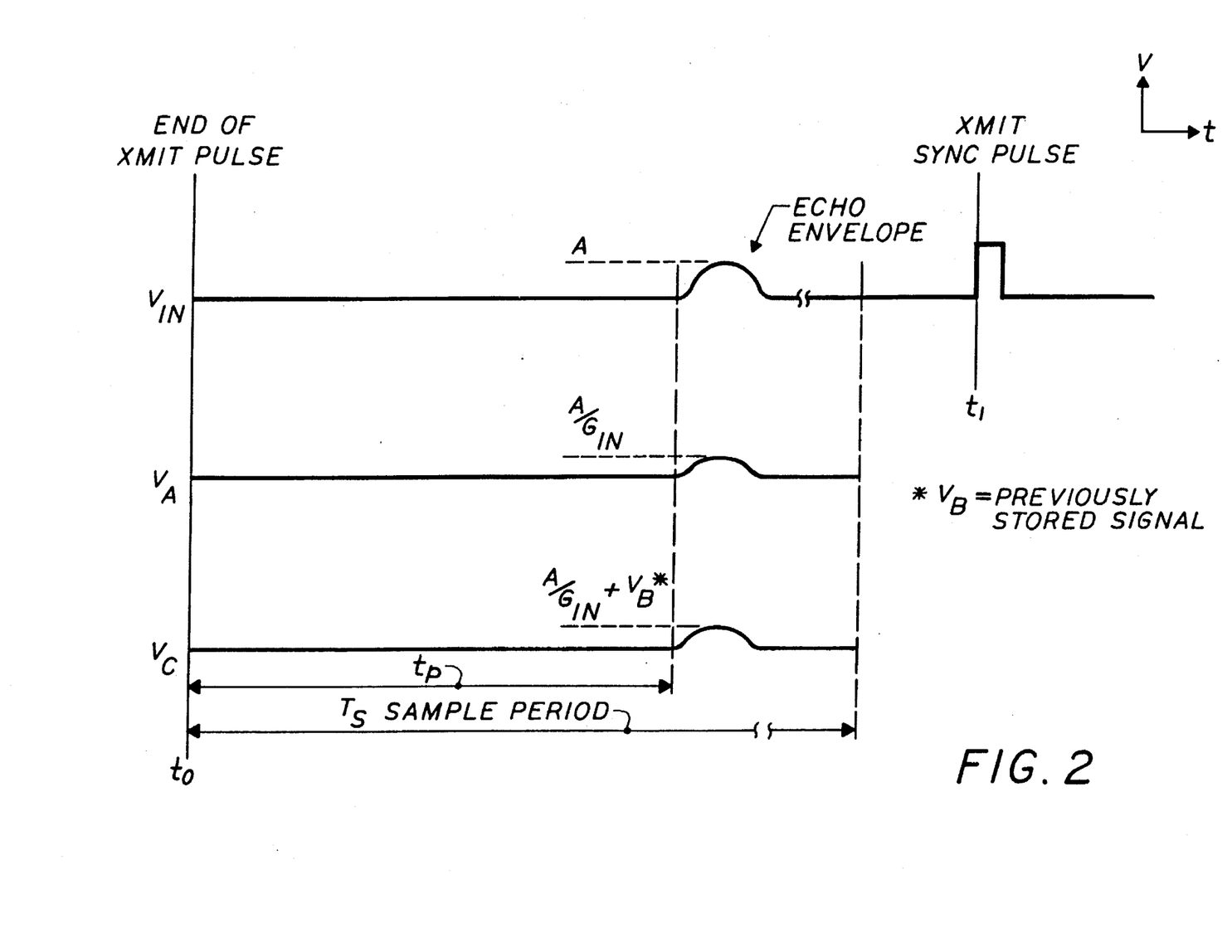
FIG. 2 is a timing diagram that shows in an exemplary manner a typical timing arrangement for input signals received by an auto-correlation filter for an ultrasonic signal processing system.

FIG. 2 illustrates the general timing relationship for an auto-correlation filter according to the invention with an ultrasonic sensing system in which a number of T/R cycles are produced. As shown in the top graph, in this example a signal cycle is considered to begin at the end of a transmit pulse period. It is important that a repeatable trigger event related to the input signals be detectable because the auto-correlation filter operates in sync with the incoming signals. The trailing edge of the transmit pulse can conveniently be used for such timing. As another example, the leading edge of the transmit control signal could be used.

Thus, at time $t_0$, the transmit pulse ends and the transducer begins the listen or receive portion of the T/R cycle. Beginning at some time $t_p$ after the end of the transmit pulse, an echo pulse is received and converted by the transducer into an electrical signal corresponding to the echo envelope. The echo envelope E typically exhibits a maximum amplitude A that occurs at a detectable time. Though not shown in FIG. 2 for clarity, the echo profile during the receive portion of the T/R cycle includes false echoes and noise. The auto-correlation filter receives the entire echo profile over a selectable time period, $T_S$, referred to herein as the sample period. The next T/R cycle begins at time $t_1$. Preferably, the sample period $T_S$ ends before time $t_1$, as shown in FIG. 2, and typically is selected to end after the maximum time has elapsed during which a valid echo can be expected to be received. It is important to recognize that in ultrasonic systems that adjust operating parameters such as burst frequency, burst length and T/R repetition rate, the time delay from $t_0$ to $t_1$ may vary, and in fact may be very long (milliseconds, for example) relative to the length of the sampling period $T_S$ or the pulse width of the echo (microseconds, for example.) The transmit pulses also may not occur at periodic intervals. Other aspects shown in FIG. 2 will be described later herein.

Referring again to FIG. 1, the input amplifier 12 receives the echo profiles in analog format whatever rate is determined by the T/R cycle rate. For purposes of this disclosure, one T/R cycle is considered to contain one echo profile of interest, but this relationship is simply for convenience and ease of explanation. In practice, the auto-correlation filter can be used to discriminate multiple synchronous components (echoes in this case) if desired, simply by using more digital memory, for example. Also, each echo profile can contain any number of synchronous components or return echoes and asynchronous components or noise.

The input amplifier is designed with a gain factor of $1/G_{in}$ that is less than unity gain. For example, $G_{in}$ could be selected to equal 33 so that the amplifier gain would be 1/33. The use of a small gain less than unity allows for averaging a large enough number of echo profiles (T/R cycle data signals) without saturating the amplifiers and also reduces input noise amplification.

The input amplifier 12 produces an output $V_A$ that corresponds to the input signal but reduced in amplitude (see FIG. 2, middle chart). The output signal $V_A$ is input to a summing circuit 14, which can be realized conveniently in the form of a differential amplifier. The output, $V_C$, of the summing circuit 14 is then input to a digitizing sample and hold (S/H) circuit 16 that converts the summed analog signals into digital form (over the sample period $T_S$) and stores at least one echo profile data set for a T/R cycle. In accordance with an important aspect of the invention, the storage device 16 need only be large enough to store a number of samples taken during one T/R cycle. Multiple memory allocations for repeated T/R cycles, such as are needed for conventional DSP systems, are not required for the present invention because the averaging is done in the analog domain. After the first cycle, however, the storage device 16 signals represent the summation of all the preceding cycles.

After an appropriate delay time based on arrival of the next input data signal to the first amplifier 12, the sample and hold circuit 16 restores the digitized signals to analog form and the output of the S/H circuit is passed through an antialiasing filter 18. The filter 18 can be realized, for example, in the form of a low pass filter, and preferably a higher order low pass filter to reduce substantially the presence of synchronized components (e.g., quantized digital switching noise) other than the signal of interest (e.g. the echo envelope in FIG. 2).

The output of the antialiasing filter 18 is passed through a loop gain adjustment amplifier 20, the analog output of which ($V_B$) is summed with the next cycle of input signals by the summing circuit 14. Note that the output of the summing circuit ($V_C$) is not only the input to the S/H circuit, but also is the filtered analog output of the auto-correlation filter ($V_{OUT}$).

A digital control logic circuit 22 is provided that generates the timing signals such as clocks and triggers used by the sample and hold circuit 16. The digital logic can be quite simple in design because the auto-correlation filter does not use high power DSP, nor does it require microprocessing and/or high level software. As shown in FIG. 1, however, the digital logic circuit can be interfaced to a microprocessor based system, as will typically be the case, for example, in a fuel gauging system in which a large number of sensors are interrogated. The digital logic circuit 22, however, can be realized in the simple form of a state machine that simply receives an appropriate timing signal from the microprocessor and thereafter operates on its own to filter the incoming signals without requiring further computing power from the microprocessor.

Operation of the auto-correlation filter 10 generally illustrated in FIG. 1 takes advantage of the periodic nature of ultrasonic echo pulses to extract that signal from a composite signal containing a large amount of asynchronous or uncorrelated noise. This is accomplished in auto-correlation filters by the averaging technique which uses a signal the echo profile) that is present in a known time frame for a certain number of repetitions. After these repeated cycles, the filter reaches a steady state output due to the fact that each new cycle makes a fairly small contribution to the average signal and asynchronous noise.

From the time of the initial transmit pulse, to a predeterminable maximum time period beyond which a true echo can occur, the transducer output is passed through the gain stage 12 with a less than unity gain factor $1/G_{in}$ and stored in the storage or memory device 16. The first stored signal is then held until the same instant ($t=t_0$) that the sampling period began for the preceding T/R period. At this time the restored and filtered analog signal is summed with the signal data of the present cycle. In other words, the stored data for an $n_{th}$ cycle is summed with the input signal of the $n_{th}+1$ cycle, the latter being multiplied by $1/G_{in}$ also. After N input cycles, the cumulative stored analog signal representations can be defined by:

$$V_{N,stored} = (V_{in,N}) * 1/G_{in} + (V_{stored,N-1}) * G_{Loop} \quad (1)$$

It is apparent from Eq. 1 that the present input contribution for an $n_{th}$ cycle, given by $(V_{in,N})*1/G_{in}$, has little effect on the averaged analog output if N and $G_{in}$ are sufficiently large.

The antialiasing filter 18 can be realized, for example, in the form of a fourth order low pass filter. This filter serves at least two important functions in the described embodiment of the auto-correlation filter. First, the filter performs a low pass cut off below the sampling frequency of the sample and hold device 16. This is important because the sampling frequency components otherwise could fold back via the feedback arrangement of the filter and create aliasing effects, and/or appear as synchronous components. The low pass filter also helps to prevent high frequency oscillation problems.

Figure 3:
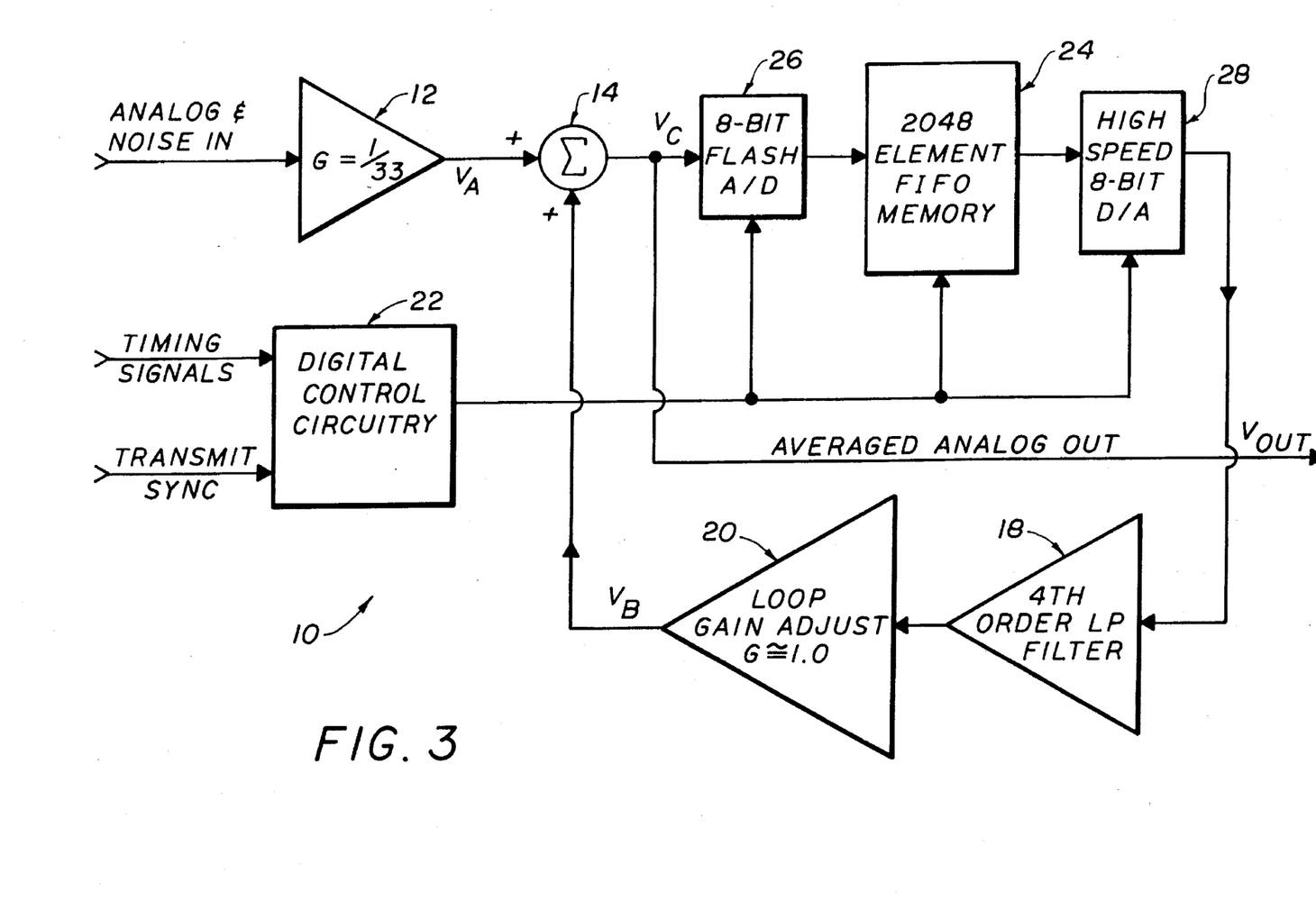
FIG. 3 is a detailed functional block diagram of the auto-correlation filter shown in FIG. 1.

With reference next to FIG. 3, I show a detailed schematic diagram of a specific embodiment of the auto-correlation filter 10 in accordance with the present invention. In FIG. 3, like components are given the same reference numeral as in FIG. 1. The detail added in FIG. 3 relates to the implementation of the sample and hold device 16. In this case, the sample and hold device 16 is realized with a first-in/first-out (FIFO) digital memory device 24 that receives digitized data from an analog-to-digital converter 26, stores that data for an appropriate time period until the next T/R cycle begins, and then outputs the digital data to a high speed digital to analog (D/A) converter 28. The use of a FIFO memory device is desirable in many applications because the data can be stored for long time delays between T/R cycles without becoming corrupted or degraded. Many different devices and circuits can be used to practice the invention as described. The A/D converter is preferably a high speed flash converter, such as part no. AD9048 available from Analog Devices. The FIFO device 24 can be part no. CY7C429 available from Cyprus Semiconductor, and the high speed D/A can be part no. DAC-08 available from Analog Devices, to give just a few examples of the many choices available to the designer. A suitable state machine for the digital circuit 22 can be configured using standard TTL or HCMOS digital logic family microcircuits. The state machine can be configured in any suitable manner as is well known in the art. Because of the simplicity of the auto-correlation filter of the present invention, the state machine will be straightforward to those skilled in the art, and detail design of the state machine forms no particular part of the present invention.

Exemplary operation of the auto-correlation filter of FIG. 3 will next be described. In this case, the filter 10 is designed to reach steady-state in about 33 cycles. The gain of the input amplifier stage 12 is set to about $1/G_{in}=1/33$. A 2048×8 bit FIFO memory is used to store digital signals from the flash A/D operating at a sample rate of 2 megahertz in a sampling window of about 1 millisecond. The use of a high speed flash A/D converter obviates the need for an input track and hold or buffer isolation circuits. The filter 10 samples the analog ultrasonic signal every 500 nanoseconds for a period of 1.024 milliseconds starting at the trailing edge of the transmit pulse.

During the first storage cycle into the FIFO memory, the data is stored into the FIFO memory but no read function occurs. This avoids the first cycle from being added back to itself. During the second cycle of the averaging sequence, the FIFO memory read begins 2 clock cycles prior to the next write into the memory. The first read of the FIFO memory represents time= $t_0$ on the previously sampled waveform. This is converted back to the analog domain by the D/A converter 28, which has an 85 nanosecond maximum conversion settling time. This analog value is then passed through a fourth order antialiasing filter 18 to eliminate the 2 Megahertz switching noise.

At this point, the first stored analog value of the previous cycle ($n_{th}$) is summed with the present first analog value of the present cycle ($n_{th}+1$) which has been divided by 33. This sum is then input to the flash A/D, and the process continues for all the data stored in the FIFO memory.

The flash A/D converter is a "pipeline" converter. In other words, the present digital output of the device represents the analog value of the previous clock cycle. Because of this, the analog digitized value is stored one clock cycle (500 nsec.) later in time. This is actually a circuit advantage, because the FIFO must have at least one empty memory location in order to write to it.

At the beginning of each analog sampling cycle, two reads occur from the FIFO before the first write cycle. Thus, one location of the FIFO is always open to write to until the last sample of the sequence (e.g. last sample of an echo profile) fills the FIFO. At the end of the analog sampling cycle, the filter is halted and the previously stored analog waveform is held in digital form in the FIFO until the occurrence of the next transmit pulse. The filter continues the accumulative averaging sequence and after about 33 cycles, a steady state condition is reached. The filter can continue to operate in a continuous real time manner to filter the incoming signals from the transducer. In this case, the output signal of interest ($V_{out}$) remains at a steady state of about 2 volts while any asynchronous noise is attenuated by at least 20 LOG(⅓₃)= −30 dB. Filter 10 resolution can be increased by increasing the speed of the flash A/D converter; however, this will be accompanied by the need for larger FIFO memory. The filter 10 response time is determined by the quiet time between transmit pulses. If $T_p$ represents the time between transmit pulses, then the response of the filter 10, in this example, can be approximated by $T_{Response}=T_p*33$.

Figure 4:
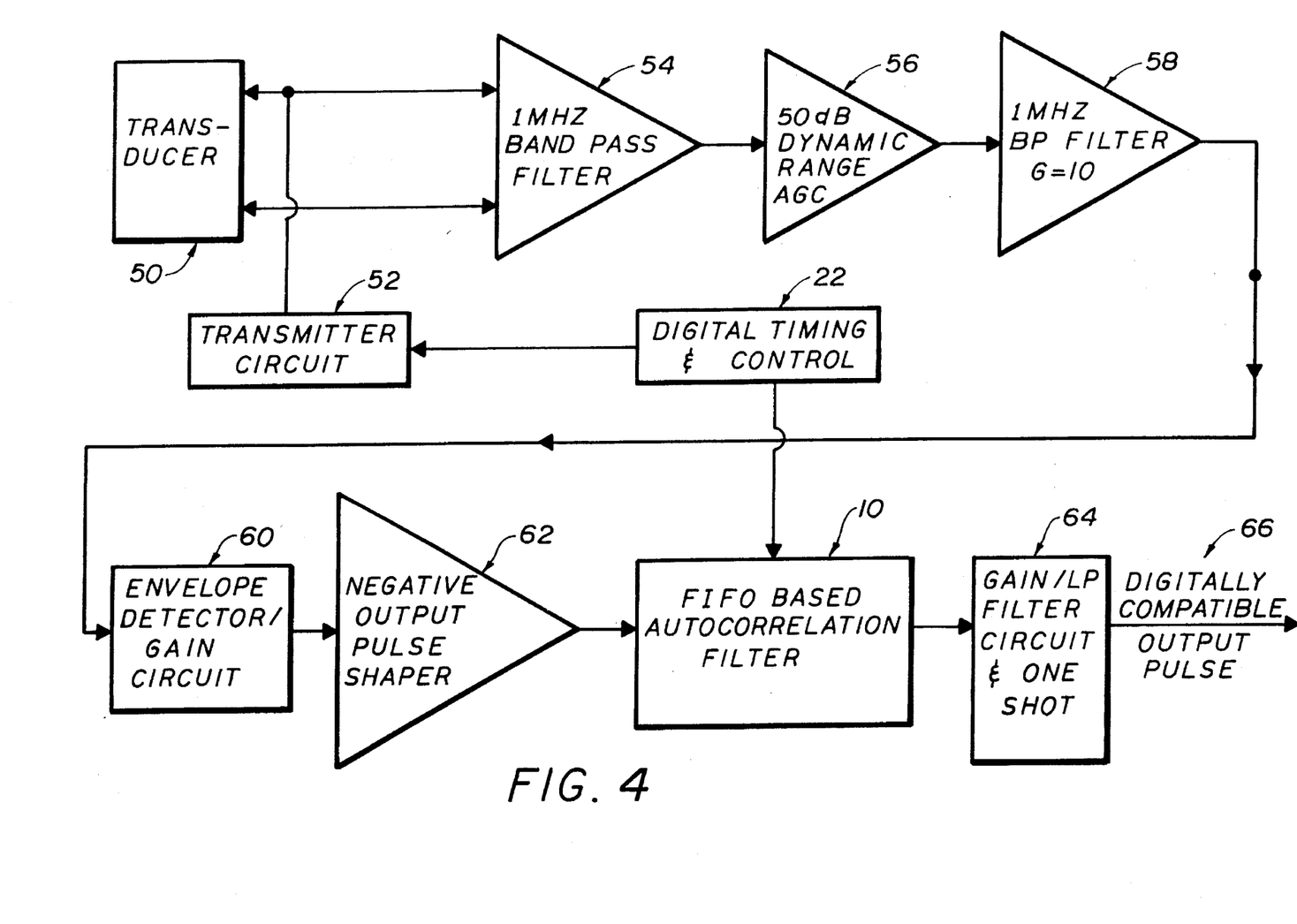
FIG. 4 is a functional block diagram of an ultrasonic echo ranging system that includes an auto-correlation filter in accordance with the invention.

With reference next to FIG. 4, I show, in functional block diagram form, an auto-correlation filter 10 according to the invention in combination with an ultrasonic signal conditioning circuit, such as could be used in a ultrasonic fuel gauging apparatus, for example. In this arrangement, the apparatus includes an ultrasonic transducer device 50 that functions as both an ultrasonic transmitter and receiver. For convenience, the digital control logic 22, such as a state machine configured to generate the appropriate clock and trigger functions for the auto-correlation filter 10, can also be used to generate transmit timing pulses. The logic control circuit sends the transmit control pulse to a transmitter circuit 52 that converts the digital logic signals to the appropriate drive signals used to energize the transducer at the selected ultrasonic pulse frequency and burst length. The transmit control signal can also be used to blank the receive circuitry until after the transducer has stopped ringing and begun the listen or receive period for the echoes.

As the echoes are received, they are converted to corresponding electrical signals. These electrical signals can then be processed using conventional signal processing circuits such as a high frequency bandpass filter 54, an AGC circuit 56, a second bandpass filter 58, a second gain stage 60 and a pulse shaper circuit 62. These circuits are well known to those skilled in the art, and operate to provide initial filtering and wave shaping of the ultrasonic analog input signals to the auto-correlation filter 10.

The input to the filter 10, however, still contains the asynchronous noise problems described hereinbefore. The filter 10 thus operates to significantly increase the signal to noise ratio by substantial attenuation of the asynchronous noise components of the analog echo profile. The filtered analog output of the filter 10 can, if desired, be input to a one-shot circuit 64 that produces a digitally compatible output pulse 66 synchronized with the leading edge of the true echo envelope. This is useful, for example, in precisely determining the roundtrip time for travel of the true echo in order to calculate the fuel height.

Figure 5:
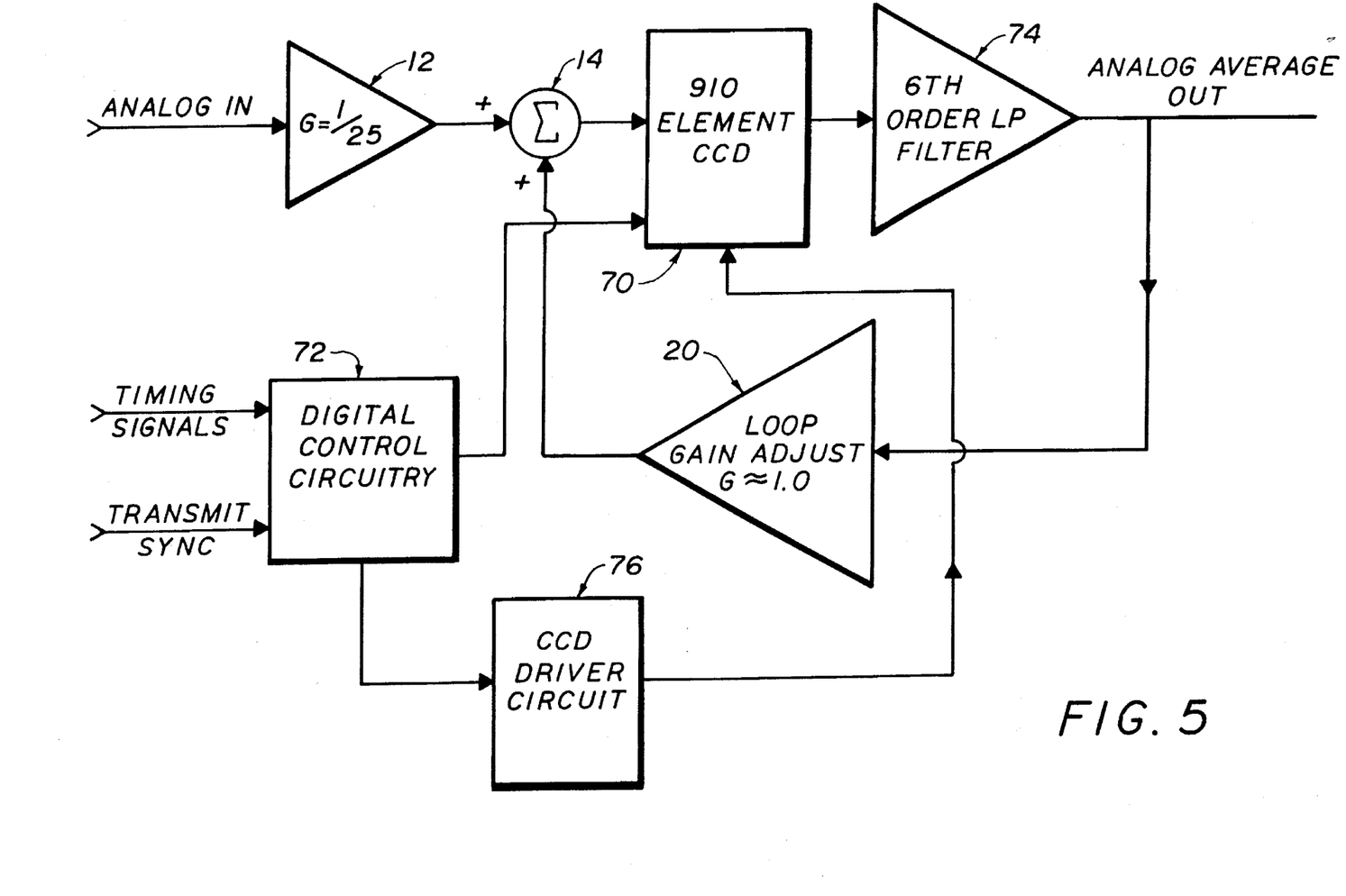
FIG. 5 is a functional block diagram of another embodiment of an auto-correlation filter according to the invention.

With reference next to FIG. 5, I show an alternative embodiment for the sample and hold unit 16 (FIG. 1). In this embodiment, rather than using analog to digital conversion for storing each echo profile in a FIFO device, a CCD (charge coupled device) device or array can be used to store the echo profile in analog form. The embodiment of FIG. 5 thus includes the input amplifier 12, and the summing circuit 14 as in the earlier described embodiments. The output of the summing circuit 14 is input and stored in a CCD array 70, which receives control clocks from the digital control logic 72. The control logic also can be used to operate the CCD driver circuit 76. Again, the control logic can be realized with a state machine using discrete logic so that the auto-correlation filter operates without DSP or microprocessor control and software. The CCD is read at the beginning of the next T/R cycle and passed through a sixth order low pass filter. The higher order filter is preferred in this embodiment due to the use of more clocking signals with the CCD compared to the FIFO device and digital sampling. The output of the filter 74 also serves as the filtered output of interest. The output is fed back to the summing circuit 14 through a gain stage 20 as in the earlier embodiments described herein.

The invention thus provides an auto-correlation filter that operates on a continuous real-time basis without the use of high power DSP or computer processing time and software. The filter accomplishes this by using a temporary storage device to hold an accumulated input signal for one or more signal cycles and then summing that average with the next incoming cycle.

While the invention has been shown and described with respect to specific embodiments thereof, this is for the purpose of illustration rather than limitation, and other variations and modifications of the specific embodiments herein shown and described will be apparent to those skilled in the art within the intended spirit and scope of the invention as set forth in the appended claims.

We claim:

1. An auto-correlation filter for increasing the signal-to-noise ratio in a signal having synchronous analog components to be detected and associated asynchronous noise components comprising: means for inputting a plurality of cycles of the signal and noise components; means for producing digitized samples of the signal and noise components over a time period that is a function of the time duration of each cycle; means for storing for an $n_{th}$ cycle said digitized samples at the end of said time period until the start of an $n_{th}+1$ cycle; means for converting said stored $n_{th}$ cycle digital samples into a corresponding restored analog signal; and means for summing said $n_{th}$ cycle restored analog signal with signal and noise components of the $n_{th}+1$ cycle corresponding to said time period.

2. The filter of claim 1 wherein said means for storing the $n_{th}$ cycle comprises a first-in/first-out memory device that stores said summed digital signal and noise data until the next cycle begins.

3. The filter of claim 2 wherein said means for digitizing comprises a flash analog-to-digital converter.

4. The filter of claim 1 wherein the filter operates in a continuous real-time mode for each cycle input to the filter.

5. The filter of claim 1 wherein said summing means comprises a low pass filter that removes sampling noise from said restored analog signal prior to summing said restored analog signal with signals of the $n_{th}$ cycle.

6. The auto-correlation filter of claim 1 in combination with an ultrasonic sensing system of the type that produces an electrical output having ultrasonic echoes and associated noise for each transmit/receive cycle.

7. The combination of claim 6 wherein said ultrasonic sensing system comprises an ultrasonic liquid gauging system.

8. The filter of claim 1 wherein said inputting means comprises amplifier means having a gain factor less than 1 (G<1).

9. The filter of claim 8 wherein said filter achieves steady state output in approximately 1/G number of said cycles.

10. The filter of claim 1 wherein each of said cycles comprises a time period for a transmit/receive acoustic echo sequence.

11. The filter of claim 10 wherein each of said cycles occurs as a discrete time interval independent of occurrence of other ones of said cycles.

12. An auto-correlation filtering method for increasing the signal-to-noise ratio in a signal having synchronous analog components to be detected and associated asynchronous components, comprising the steps of:

a. receiving cycles of the synchronous and asynchronous components;

b. storing a portion of said synchronous and asynchronous components corresponding to at least a time interval of an $n_{th}$ cycle until the start of an $n_{th}+1$ cycle;

c. summing in the analog domain said stored $n_{th}$ cycle portion with a corresponding portion of said $n_{th}+1$ cycle synchronous and asynchronous components; and d. repeating steps a, b and c.

13. The method of claim 10 wherein the step of storing said components includes the steps of digitizing said components and storing said digital values in a memory device.

14. The method of claim 11 wherein the step of storing values in a memory device is performed using a FIFO memory device.

15. The method of claim 11 further comprising the step of restoring said digital values to analog signals prior to said summing step.

16. The method of claim 13 wherein said restoring step includes the step of filtering switching noise produced during said digitization step.

17. An auto-correlation filter for increasing the signal-to-noise ratio in a signal having synchronous analog components to be detected and associated asynchronous components comprising: means for inputting a plurality of cycles of the synchronous and asynchronous components; means for storing a portion of the synchronous and asynchronous components corresponding to at least a time interval of an $n_{th}$ cycle; and means for analog summing said portion of said $n_{th}$ cycle synchronous and asynchronous components with a corresponding portion of $n_{th}+1$ cycle synchronous and asynchronous components.

18. The filter of claim 17 wherein said storing and summing functions are performed on a real-time continuous basis for said plurality of cycles.

19. The filter of claim 18 wherein said summing function is performed in the analog domain.

20. The filter of claim 19 that operates independent of digital signal processing or microprocessor control.

21. The filter of claim 17 wherein said storing means comprises a flash A/D converter that digitizes said $n_{th}$ cycle synchronous and asynchronous components, and a FIFO filter that stores said $n_{th}$ cycle synchronous and asynchronous components until the start of the $n_{th}+1$ cycle.

22. The filter of claim 21 further comprising means for converting said stored digitized components back to analog components prior to said summation with the $n_{th}+1$ cycle components.

23. The filter of claim 22 further comprising an antialiasing filter to remove digital sampling noise from said converted analog components prior to said summation.

24. The filter of claim 17 wherein said storing means comprises a CCD array.

* * * * *